United States Patent [19]
Lee et al.

[11] Patent Number: 5,387,495
[45] Date of Patent: Feb. 7, 1995

[54] SEQUENTIAL MULTILAYER PROCESS FOR USING FLUORINATED HYDROCARBONS AS A DIELECTRIC

[75] Inventors: James C. K. Lee; Arshad Ahmad, both of Santa Clara County; Chune Lee, San Francisco County; Myrna E. Castro; Francisca Tung, both of Santa Clara County, all of Calif.

[73] Assignee: Digital Equipment Corporation, Maynard, Mass.

[21] Appl. No.: 864,375

[22] Filed: Apr. 6, 1992

Related U.S. Application Data

[63] Continuation of Ser. No. 372,684, Jun. 28, 1989, abandoned.

[51] Int. Cl.[6] .................................................. G03C 5/00
[52] U.S. Cl. ...................................... 430/315; 430/314; 430/319; 430/324
[58] Field of Search ................. 430/314, 315, 319, 324

[56] References Cited

U.S. PATENT DOCUMENTS

| | | | |
|---|---|---|---|
| 3,466,206 | 9/1969 | Beck | 156/651 |
| 3,791,858 | 2/1974 | McPherson et al. | 430/319 |
| 4,680,220 | 7/1987 | Johnson | 428/240 |

OTHER PUBLICATIONS

Draper, Printed Circuits and Electronics Assemblies, Robert Draper Ltd, Great Britian, 1969, pp.92–108.
Seraphim et al. "Principles of Electronic Packaging" McGraw-Hill Book Co., New York, 1989, pp. 348–356.

*Primary Examiner*—Marion E. McCamish
*Assistant Examiner*—Kathleen Duda
*Attorney, Agent, or Firm*—Flehr, Hohbach, Test, Albritton & Herbert

[57] ABSTRACT

A method of forming a multilayer circuit board is disclosed which includes a build-up process in which, beginning with a solidified layer of the dielectric disposed upon a substrate, alternate layers of conducting metal and dielectric are sequentially deposited. Each layer of conducting metal lines is defined using photoresist and a photolithographic technique. After the lines are deposited, the photoresist is removed and a second layer of photoresist defines the conductive posts which function as through holes between metal layers. After each layer of conductive line and posts is formed, and the photoresist is removed, the dielectric is flowed into place and solidified to insulate adjacent metal lines and posts. The process may be repeated as many times as necessary to build up layers of conducting metal and dielectric, and form the completed multilayer wiring board.

20 Claims, 3 Drawing Sheets

SEQUENTIAL MULTILAYER PROCESS FOR USING FLUORINATED HYDROCARBONS AS A DIELECTRIC

This is a continuation of application Ser. No. 07/372,684 filed on Jun. 28, 1989, now abandoned.

FIELD OF THE INVENTION

The invention is related generally to the field of multilayered boards, and more particularly to a process for forming such boards without lamination of layers or drilling of holes by using a flowable, fluorinated hydrocarbon as a dielectric and photographic techniques to produce a new multilayer board with very low dielectric constant and significant reduction in via size for creating contact between conducting layers.

BACKGROUND OF THE INVENTION

In parallel with an increasing tendency toward the miniaturization of integrated circuits in the electronic industry, there has been a trend aimed at the production of circuit boards which permit high density mounting to take full advantage of the miniaturization of the devices. However, with the movement to higher and higher density, the size of the plated through holes between conductive metal layers in the printed circuit boards must get smaller. The present technology requires hole diameters of under 0.005 inch. Drilling these holes is not possible with the current technology, and maintaining the tight tolerances on the size of the holes has reached the limits of machine capabilities.

Therefore, one of the problems to be addressed by the present invention is to provide a method for obtaining connecting through holes or posts between layers in a multilayer board which are smaller in diameter than 0.005 inch, and in fact reach diameters as low as 0.0015 inch.

A related problem to be addressed by this same invention lies in the different dielectric materials used in the present manufacture of printed wiring boards. At this time, the dielectric material that has the best overall properties is the polyimide. However, there are three basic problems inherent in this material. Polyimide, like all other dielectrics on the market, absorbs moisture from the atmosphere when left in an open area, and also during any wet processing step in the construction of the board. This moisture tends to degrade the material and weaken adhesion between the dielectric and metal layers. Further, polyimide has a dielectric constant of about 3.5 which is sufficient for the present needs. However, the high performance computer board requires a lower dielectric constant to satisfy the high speed signal propagation requirements.

Finally, the present technology requires that a multilayer board be constructed of separate layers of conducting metal and dielectric, and these layers laminated together and appropriate through holes drilled in the surface, and these holes then be plated. After these steps are completed, the board can be tested for functionality. If there is any defect in the board, it cannot be detected until the complete core or the completed printed wiring board has been built. Thus, a further problem to be addressed by this invention is the adoption of a method and structure for a printed wiring board which will allow for easier testing as the assembly of a printed wiring board is progressing.

SUMMARY OF THE INVENTION

A primary objective of the present invention is to adopt a more economically efficient, method of manufacturing multilayer printed wiring boards.

More particularly, it is an objective of this invention to adopt a process for the manufacture of printed wiring boards which is capable of achieving holes connecting layers on the multilayer board which are much smaller in diameter than those capable of being achieved by known technology.

A further objective of the present invention is to incorporate the use of a dielectric which has improved dielectric constant, and which may be incorporated in the method of assembly without the need of lamination process.

In summary, according to the present invention, a sequential process for manufacturing a multilayer board is disclosed wherein the dielectric is a flowable, fluorinated hydrocarbon such as tetra-fluoroethylene which is flowed into place and then solidified to provide the insulating dielectric between metal Signal lines in a signal core.

The method includes a build-up process in which beginning with a solidified layer of the dielectric disposed upon a substrate, alternate layers of conducting metal and dielectric are sequentially deposited. Each layer of conducting metal lines is defined using photoresist and a photolithographic technique, after the lines are deposited, the photoresist is removed and a second layer of photoresist defines the conductive posts which function as through holes between metal layers. After each layer of conductive line and posts is formed, and the photoresist is removed, the dielectric is flowed into place and solidified to insulate adjacent metal lines and posts. The process may be repeated as many times as necessary to build up layers of conducting metal and dielectric, and form the completed multilayer wiring board.

As a result of the adoption of this method utilizing flowable fluorinated hydrocarbons as a dielectric material to build the multilayer board interconnect structure, lamination is eliminated. The method of hole formation and planarization without drilling obtains holes that are as small as 0.0015 inch or less in diameter for creating contacts between conducting layers that are separated by the nonconducting layer. The use of the flowable fluorinated hydrocarbon provides a material with a dielectric constant of 2.0–2.1, allowing a 40 percent reduction in the thickness of the dielectric layer, and an improvement of more than 20% of signal propagation speed (compared with polyimide material).

The method to be described and detailed below is a reverse of the conventional processing techniques. It provides very tight dimensional controls, and simplifies the method of making multilayered printed wiring boards. It can be used by the printed wiring board industry, the integrated circuit board industry, and all processes using a combination of the two. No drilling is required for very fine holes, and the layers can be inspected individually as each layer is completed, instead of waiting for the board to be completed and tested as a unit. The 40 percent reduction in the deposited thickness of the dielectric material translates into more layers of circuits for the same overall thickness of the printed wiring board, thus providing savings in both the manufacturing costs and in space requirements.

The sequential deposition of alternating layers of a metal such as copper and the flowable dielectric eliminates the lamination process used in the existing technology. This eliminates the need for adhesives and high temperature pressure lamination steps.

The achievement of significantly smaller holes means less wasted space and higher current density in a much more compact circuit layout. This results in a better performance of the product in less occupied space.

The above and other objects of the present invention, and the features and advantages thereof will become more apparent from the following detailed description taking in conjunction with the drawings.

DETAILED DESCRIPTION OF A PREFERRED EMBODIMENT

Figure 1A:
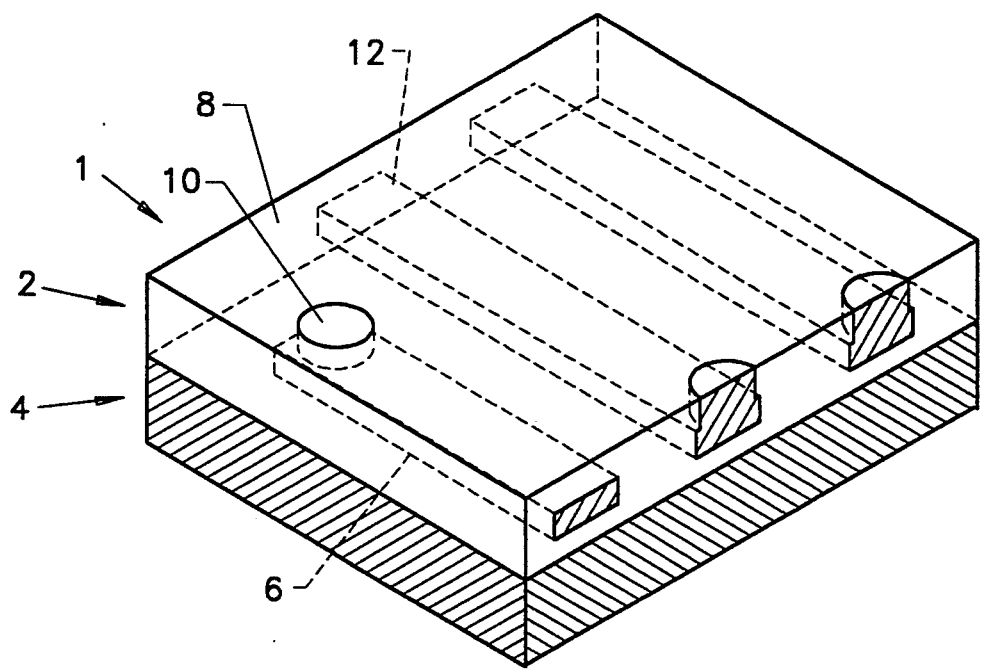
FIGS. 1A and 1B are isometric views of completed single-layer and multilayer boards showing the lines and through hole posts which connect the lines.
Figure 1B:
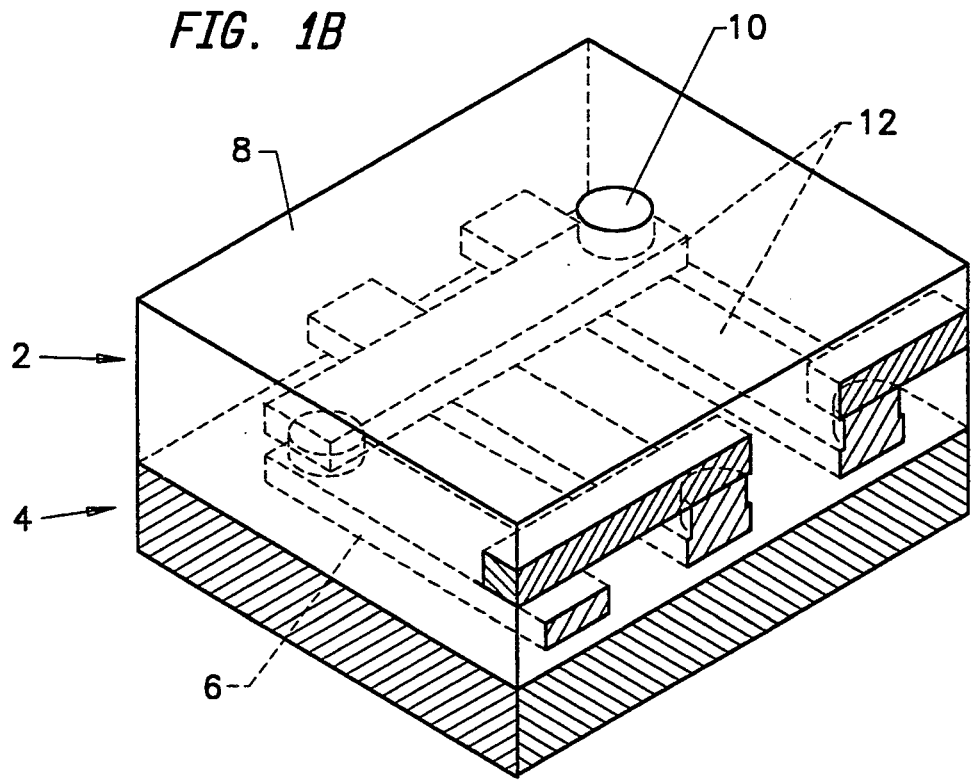

A description of the present invention will now be given with respect to FIGS. 1A and 1B, which is an enlarged vertical sectional view of a finished multilayer board as generally indicated by the reference numeral 1. The multilayer boards generally indicated by the numeral 2 are built up sequentially on a substrate 4 by depositing several layers alternating between a conducting metal 6 generally indicated by the hatch regions, and a dielectric 8 generally represented by the unmarked regions. The conducting metal is laid down in the form of signal lines running parallel to the surface of the substrate 4. The lines in a single layer (as shown in FIG. 1A) may run in parallel (e.g., the X-direction). The lines on the adjacent, vertically displaced layer will form a different pattern (as shown in FIG. 1B), which crosses over the lines on the first layer, and must be connected thereto at these crossover points. The metal lines 6 need to be connected through the dielectric material 8 at these crossover points to form electrically conductive paths to complete each signal core. The metal lines may also need to be connected to the substrate or to the top surface of the multilayer board. Therefore, connecting paths perpendicular to the surface of substrate 4 are formed in the dielectric 8 by defining posts 10 of an electrical conductor (e.g., copper) on the metal lines 12 before applying the dielectric layer 8 (by a process to be explained with reference to FIG. 2). The metal lines 12 are formed one layer at a time, and patterned using photoresist techniques. The completed multilayer board may consist of as many layers as necessary, alternating between posts or through holes and lines.

Turning next to FIG. 2, the complete process for building each layer of the multilayer board is shown in FIGS. 2A–2J and begins with the substrate 4. First a thin insulating layer 30 of the dielectric is applied to the substrate surface by printing, roller coating, spin coating, spray coating, or the like, method. It is important to note that this dielectric is flowed into place, and hardened on the surface of the core 4 rather than laminated. The general approach of this process is to avoid any form of lamination, as it inevitably results in greater thicknesses, the use of undesirable heat and pressure treatment steps, and variations in thickness of the deposited layers.

After curing of the dielectric 30, a seed layer 32 of copper or other conductive metal is deposited using sputtering or autocatalytic process. This seed layer over the dielectric is to form the electrical connections which are to be further defined by the photoresist and exposure steps which follow below. The seed layer forms the base for the lines 10 running parallel to the surface of the core or substrate 4.

Figure 2A:
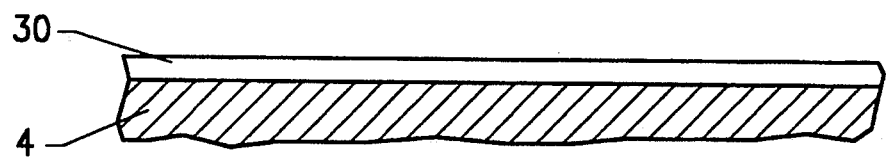
FIGS. 2A–2J is a series of sectional views for explaining the method for producing the very high density multilayer board of the present invention.
Figure 2B:
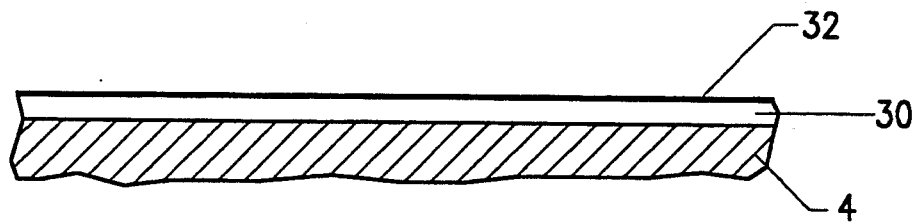
Figure 2C:
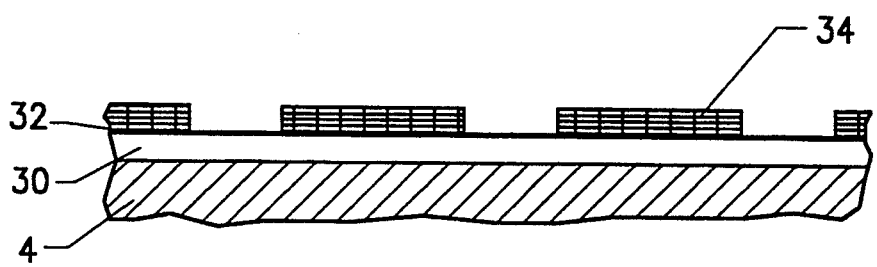

Referring next to FIG. 2C, a photoresist 34 is applied on the seed layer 32, and exposed and developed to define the pattern of the lines 10 running over the surface of the substrate. It is this step which will define the pattern for the metal lines which are then deposited in the step shown in FIG. 2D to partially establish one level of a complete board.

Figure 2D:
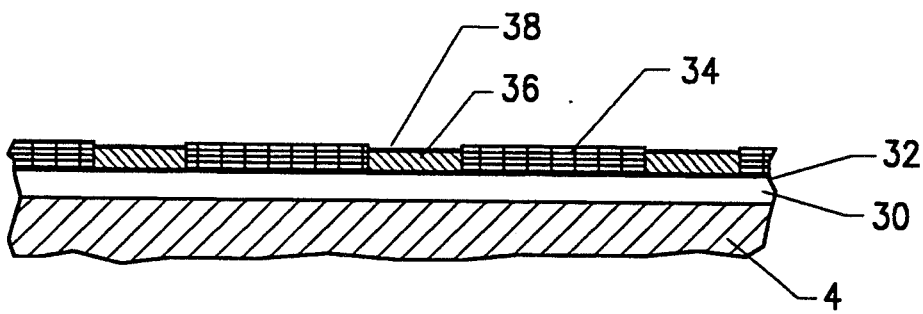

Referring to FIG. 2D, a conductive material such as copper 36 is electroplated on the seed layer 32 to the desired thickness and configuration of the conductive lines for the signal core. To maximize the electrical conductivity and ability to form connections of these lines to the posts 10 to be defined in the steps below, a flash of chromium or nickel 38 is now deposited on top of the copper 36.

Figure 2E:
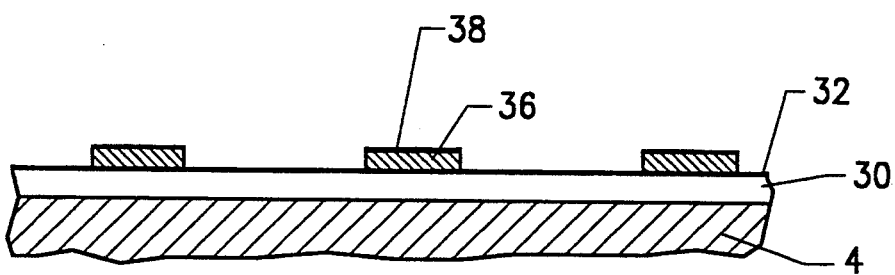

Photoresist 34 is now stripped away, as shown in FIG. 2E, leaving the lines 36 topped by the nickel flash 38 standing on the copper seed layer 32 and dielectric 30.

Figure 2F:
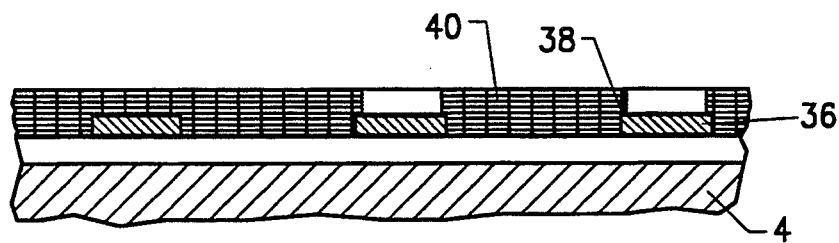

Referring next to FIG. 2F, a second layer of photoresist 40 is now applied, exposed and developed to give the pattern for the posts which will form the connections perpendicular to the substrate 4. These connections may be from the substrate 4 to any layer of signal lines, between the signal lines, or from the top layer of signal line to the top surface of the multilayer board.

Figure 2G:
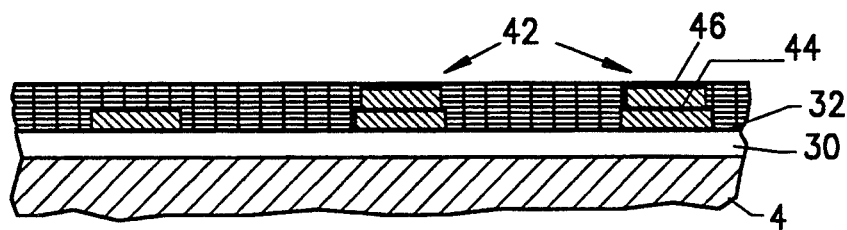
Figure 2H:
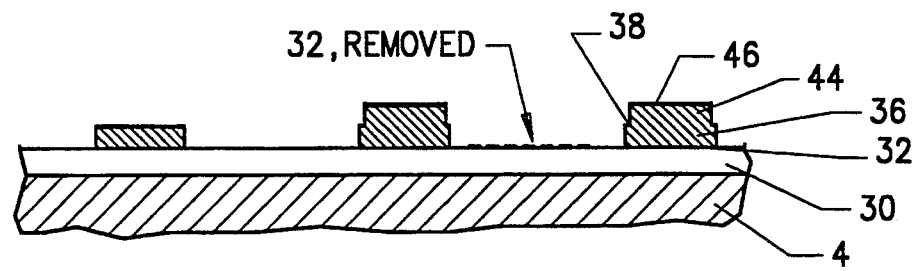

Referring next to FIGS. 2G and 2H, the chromium or nickel flash is now chemically etched from the exposed areas on the previously-defined lines 36, and copper is electroplated through the openings 42 in the photoresist layer 40 to define the perpendicular connecting posts 10. These posts, 44, are topped with a flash of chromium or nickel 46.

Figure 2I:
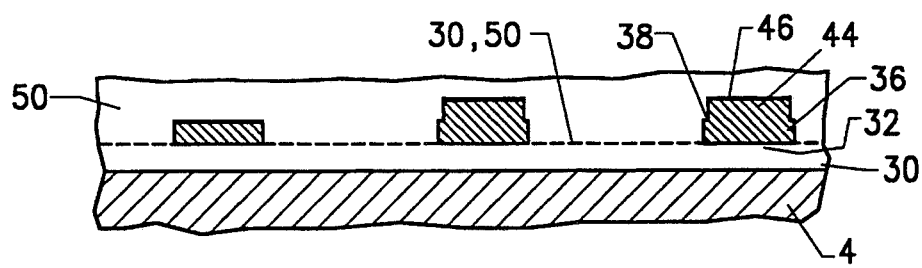
Figure 2J:
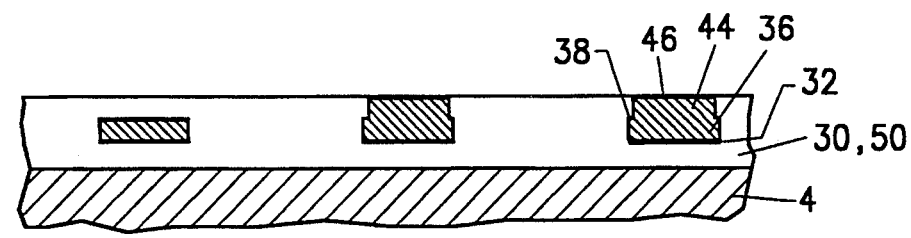

As shown in FIG. 2I, the second layer of photoresist 40 is now stripped from the surface defined by seed layer 32; and the copper seed layer 30 is subjected to a wet etch to remove all of the seed layer except the portions protected from the wet etch by the presence of metal lines 12 and/or posts 10. Therefore, the posts 10 and lines 12 are now sitting directly on the dielectric layer 30 previously flowed into place and solidified. Now the dielectric layer which will insulate adjacent posts and lines as previously formed is built up to cover the lines and posts by flowing the material into place by printing, roller coating, spin coatings, spray coating or the like method. The thickness of the dielectric layer at this point in the process should be greater than the height of the posts from the base plane so as to cover the posts. This dielectric 50 is solidified, and planarized as shown in FIG. 2J to be flush with the top of the posts 40. This can be done by lapping, laser etching, plasma etching, or any other of the known methods.

As desired, additional levels of the board comprising layers of lines and posts may then be put in place and insulated from the other lines and posts by flowing a further layer of dielectric over the defined lines and posts using steps as shown in FIGS. 2B–2J.

The completed structure of the very high density multilayer fine-lined package consists of the substrate 4 and one or more X and Y layers of lines 12 for the board as shown in FIG. 1B.

The signal lines 12 running in the X direction appear in FIG. 1A, with the posts 10 atop isolated regions of the signal lines 12. These posts 10 as shown in FIG. 1A may be used to make connections between the signal lines 12 and the top surface of the multilayer board so that connections may be made via a pad layer to external integrated circuits or other components. The same posts may be extended down to the lower layer to make contact to the substrate 4.

By repeating the processing sequence described above, a series of lines 12 running orthogonally to the first series of lines may also be deposited, with the metal through holes or posts 10 overlying selected regions of each line to provide connections between the lines on different layers. The process of using photoresist techniques to define the lines and/or posts, and then flowing a dielectric into place may be repeated as many times as necessary to build up the desired number of layers.

Although many flowable dielectrics may be used in this process, it is preferable to use fluorinated hydrocarbon, tetra-fluorethylene (PTFE), fluorinated ethylene propopylene (FEP), a combination of any of these, or a combination of any of these with polyimide. This material has a low dielectric constant, minimizing the thickness of the board and a required lateral separation of posts and lines.

Other alternatives to the present invention may become apparent to a person of skill in the art who studies the present invention disclosure. Therefore, the scope of the present invention is to be limited only by the following claims.

What is claimed is:

1. A method of forming a multilayered board interconnect structure on a substrate, said method including the steps of:
   coating a bop surface of said substrate with an insulating layer of tetra-fluoroethylene,
   depositing a seed layer of highly conductive material over said insulating layer,
   depositing a first layer of one or more conductive lines parallel to said top surface of said substrate, said layer of tetra-fluoroethylene insulating said one or more conductive lines from said substrate,
   depositing a patterned layer of electrically conductive posts extending perpendicularly above said substrate, said posts being located to overlie selected locations on said one or more conductive lines,
   removing the portions of said seed layer which are not covered by said one or more conductive lines and said posts, and
   depositing a layer of liquid consisting essentially of fluorinated hydrocarbon having a dielectric constant in the range 2.0 to 2.1 around said posts to provide isolation between said posts,
   whereby said multilayered board may be formed without lamination of successive layers or drilling holes.

2. A method as claimed in claim 1 including the steps of:
   prior to said step of depositing a first layer of one or more conductive lines, applying, exposing and developing a layer of photoresist over said substrate to establish the locations and patterns of said one or more conductive lines.

3. A method as claimed in claim 1 wherein:
   said step of depositing a first layer of one or more conductive lines includes forming a first patterned layer of photoresist over said seed layer, laying down said one or more conductive lines in openings defined by said first patterned layer of photoresist, and removing said first patterned layer of photoresist.

4. A method as claimed in claim 3 including the steps of:
   after removing said first patterned layer of photoresist, forming a second layer of photoresist having openings for said copper posts aligned with selected portions of said one or more conductive lines, and after said step of depositing a patterned layer of copper posts, removing said second layer of photoresist and said seed layer, and then covering said copper posts and said one or more conductive lines with a second layer of flowable tetra-fluoroethylene to insulate adjacent posts and lines.

5. A method as claimed in claim 4 including the step of:
   planarizing said second layer of tetra-fluoroethylene to be flush with the top of said copper posts so that further layers of conductive lines and copper posts may be deposited.

6. A method as claimed in claim 5 wherein:
   said second layer of tetra-fluoroethylene is originally deposited to a greater thickness than the height of said copper posts, whereafter said planarizing step is carried out.

7. A method as claimed in claim 6 including depositing additional layers of conductive lines and copper posts by repeating the steps of forming a first layer of photoresist, depositing a layer of one or more conductive lines, removing said first layer of photoresist, forming a second layer of photoresist, depositing a patterned layer of copper posts, removing said second layer of photoresist, and depositing a layer of flowable tetra-fluoroethylene.

8. A method as claimed in claim 4 including the step of:
   prior to said step of removing said second layer of photoresist, depositing a flash of chromium or nickel atop said copper posts.

9. A method as claimed in claim 3 including the step of:
   prior to removing said first patterned layer of photoresist, depositing a flash of chromium or nickel atop said one or more conductive lines.

10. The method of claim 1, wherein said electrically conductive posts are copper.

11. A method of making a multilayered printed wiring board pattern on a planar substrate, said multilayered printed wiring board pattern including a pattern of electrically conductive horizontal buried lines running parallel to said substrate and electrically conductive vertical posts perpendicular to said substrate, said method including the steps of:
   coating the surface of said substrate with an insulating layer of tetra-fluoroethylene,
   depositing a seed layer of highly conductive material over said insulating layer,
   depositing a first layer of one or more conductive lines parallel to a top surface of said substrate to form said buried horizontal lines, said layer of tetra-fluoroethylene insulating said one or more conductive lines from said substrate, patterning layers of photoresist having a dielectric constant in the range 2.0 to 2.1 to define the location and direction of said horizontal lines and said vertical posts, said posts being located to overlie selected locations on said one or more conductive lines, forming said lines and said posts, and applying liquid consisting essentially of fluorinated hydrocarbon around said lines and said posts to provide isolation between said lines and said posts, whereby a multilayered board is formed without lamination of successive layers or drilling holes.

12. A method as claimed in claim 13 including the steps of:

prior to said step of depositing a first layer of one or more conductive lines, applying, exposing and developing a layer of photoresist over said substrate to establish the locations and patterns of said one or more conductive lines.

13. A method as claimed in claim 11 wherein:

said step of forming said lines includes forming a first patterned layer of photoresist over said seed layer, laying down said lines in openings defined by said first patterned layer of photoresist, and removing said first patterned layer of photoresist.

14. A method as claimed in claim 13 including the steps of:

after removing said first patterned layer of photoresist, forming a second layer of photoresist having openings for said posts aligned with selected portions of said lines, and, after said step of forming said posts, removing said second layer of photoresist and said seed layer, and then covering said posts and said lines with a second layer of flowable tetra-fluoroethylene to insulate adjacent posts and lines.

15. A method as claimed in claim 14 including the steps of:

prior to said step of forming said lines, applying, exposing and developing said first patterned layer of photoresist over said substrate to establish the locations and patterns of said lines.

16. A method as claimed in claim 15 including the step of:

planarizing said second layer of tetra-fluoroethylene to be flush with the top of said posts so that further layers of lines and posts may be formed.

17. A method as claimed in claim 15 including the step of:

prior to said step of removing said second layer of photoresist, depositing a flash of chromium or nickel atop said posts, said posts being formed of copper.

18. A method as claimed in claim 16 including depositing additional layers of lines and posts by repeating the steps of forming a first layer of photoresist, forming said lines, removing said first layer of photoresist, forming a second layer of photoresist, forming said posts, removing said second layer of photoresist, and depositing a layer of flowable tetra-fluoroethylene.

19. A method as claimed in claim 13 including the step of:

prior to removing said first patterned layer of photoresist, depositing a flash of chromium or nickel atop said lines.

20. The method of claim 11, wherein said electrically conductive lines and posts are copper.

* * * * *

UNITED STATES PATENT AND TRADEMARK OFFICE
CERTIFICATE OF CORRECTION

PATENT NO. : 5,387,495
DATED : February 7, 1995
INVENTOR(S) : James C.K. Lee

It is certified that error appears in the above-identified patent and that said Letters Patent is hereby corrected as shown below:

Column 5,
Line 41, delete "bop" and insert therefor -- top --

Signed and Sealed this

Twenty-eighth Day of June, 2005

JON W. DUDAS
*Director of the United States Patent and Trademark Office*